(12) United States Patent
Yamamoto

(10) Patent No.: US 7,080,280 B2
(45) Date of Patent: Jul. 18, 2006

(54) POWER FAILURE SENSING DEVICE AND A CARD READER HAVING A POWER FAILURE SENSING DEVICE

(75) Inventor: Hisashi Yamamoto, Shimosuwa-machi (JP)

(73) Assignee: Nidec Sankyo Corporation, Nagano (JP)

( * ) Notice: Subject to any disclaimer, the term of this patent is extended or adjusted under 35 U.S.C. 154(b) by 606 days.

(21) Appl. No.: 10/184,188

(22) Filed: Jun. 27, 2002

(65) Prior Publication Data
US 2003/0018933 A1 Jan. 23, 2003

(30) Foreign Application Priority Data
Jun. 28, 2001 (JP) ............................. 2001-197347

(51) Int. Cl.
G06F 11/00 (2006.01)

(52) U.S. Cl. ..................... 714/22; 714/47; 713/340

(58) Field of Classification Search ............... 714/22, 714/47; 713/340; 702/27
See application file for complete search history.

(56) References Cited

U.S. PATENT DOCUMENTS

| | | | | |
|---|---|---|---|---|
| 4,003,030 A | * | 1/1977 | Takagi et al. ............... 705/24 |
| 4,356,550 A | | 10/1982 | Katzman et al. |
| 4,645,914 A | | 2/1987 | Hiraishi |
| 4,650,976 A | * | 3/1987 | Hiraishi ....................... 235/379 |
| 4,763,333 A | | 8/1988 | Byrd |
| 5,056,018 A | * | 10/1991 | Ikoma ........................... 705/24 |
| 5,394,066 A | * | 2/1995 | Leroux ......................... 315/366 |
| 5,471,153 A | * | 11/1995 | Martin ........................ 324/763 |
| 5,818,781 A | | 10/1998 | Estakhri et al. |
| 5,845,134 A | | 12/1998 | Arai |
| 6,079,026 A | | 6/2000 | Berglund et al. |
| 6,154,845 A | | 11/2000 | Ilkbahar et al. |
| 6,202,171 B1 | | 3/2001 | Townsley et al. |

FOREIGN PATENT DOCUMENTS

| | | |
|---|---|---|
| GB | 2 238675 A | 6/1991 |
| JP | 57-127220 | 8/1982 |
| JP | 07-152844 | 6/1995 |
| WO | WO 01/53846 A1 | 7/2001 |

* cited by examiner

*Primary Examiner*—Robert Beausoliel
*Assistant Examiner*—Yolanda L Wilson
(74) *Attorney, Agent, or Firm*—Reed Smith LLP

(57) ABSTRACT

A power failure detection system for detecting power failures in a cash dispenser machine and in an associated card reader includes an external signal input part for receiving a power failure signal from a first power failure sensing circuit located in a host cash dispenser machine, a card reader associated with the cash dispenser; an internal power source located in the card reader, a second power failure sensing circuit located in the card reader; a power failure signal output part for receiving and processing power failure signals from the external signal input part and from the second power failure sensing circuit. The power failure signal output part contains a circuit to output a final power failure signal if either the card reader or the cash dispenser has a power failure wherein the shape of said final power failure signal indicates whether the card reader or the cash dispenser or both experience a power failure.

4 Claims, 3 Drawing Sheets

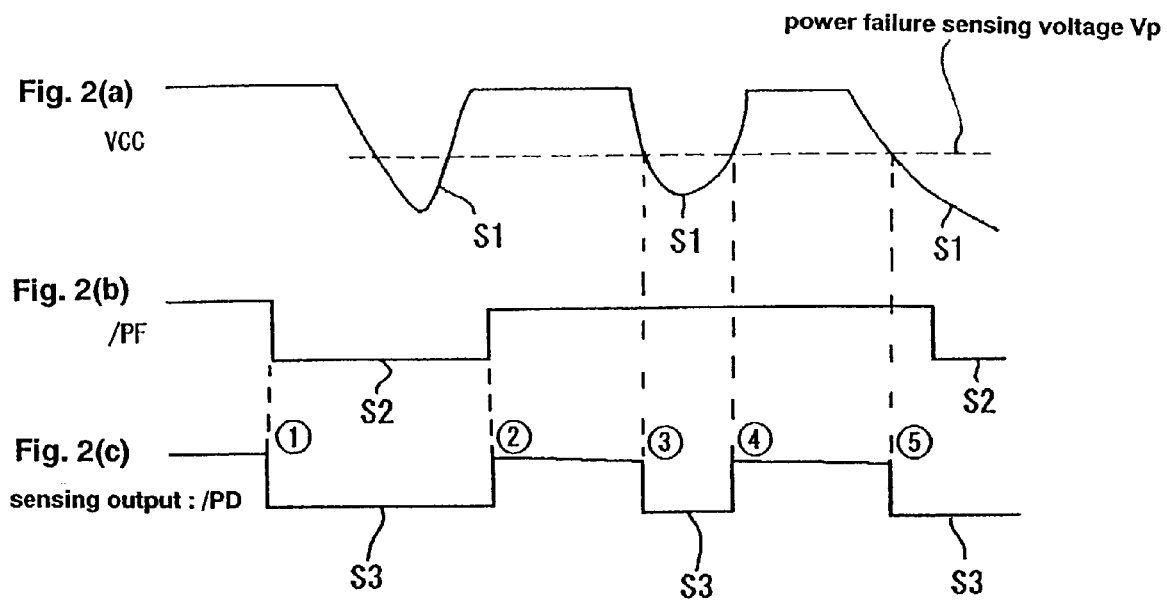
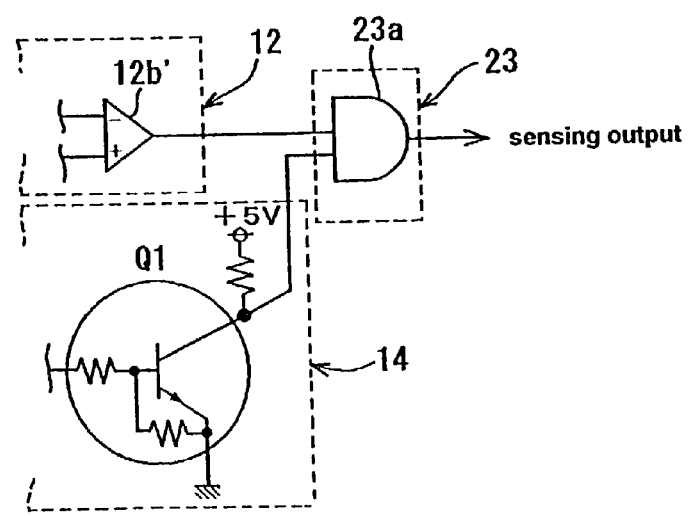
Fig. 3

POWER FAILURE SENSING DEVICE AND A CARD READER HAVING A POWER FAILURE SENSING DEVICE

CROSS REFERENCE TO RELATED APPLICATIONS

This application claims foreign priority to Japanese application no. 2001-197347 filed Jun. 28, 2001, the disclosure of which is hereby incorporated by reference.

FIELD OF THE INVENTION

The present invention relates to power failure sensing devices and card reader devices.

BACKGROUND OF THE INVENTION

Generally, in various devices, a power failure sensing device is employed broadly. For example, in a power failure sensing device shown in FIG. 6, an output voltage from an internal electrical power source 1 provided in a use apparatus is altered by a reference voltage by a regulator 2 and the reference voltage is outputted to a comparator 3. Also, as the output voltage from the internal electrical power source 1 is altered a power failure sensing voltage is created by resistors R1, R2 and the power failure sensing voltage is outputted to comparator 3.

When the output voltage from the internal electrical power source 1 falls to less than a predetermined level, a power failure sensing signal (L signal) is generated. However, for example, as a card reader is used in a cash dispenser and the like, the card reader, a subordinate use apparatus, is controlled by the host external device. In the subordinate use apparatus, when a power failure occurred in a power source of the interior side of the subordinate use apparatus, the state of the power failure of the subordinate use apparatus can be detected by the power failure sensing device as described above.

It is problematic not to be able to detect the state of a power failure when an occurrence is detected in the host external device side. That is, even if a power failure does not occur in the use apparatus itself as a subordinate device, there may be cases where a power failure occurs in the host external device side. Thus, the state of the power failure of the external device side keeps the failure at the subordinate device not detected. As a result, when an operation of the use apparatus as a subordinate device is continued, drawbacks are given to an operation of the whole device.

Accordingly, it is a object of the present invention to provide a power failure sensing device which can detect well the state of a power failure of an external device side in addition to a power failure sensing of the interior side with a simple configuration and a card reader having the power failure sensing device.

SUMMARY OF THE INVENTION

In order to achieve the above purpose, a power failure sensing device according to the present invention has a power failure sensing circuit of a use apparatus and provides an outside signal input part receiving power failure signal from an external device is provided and a power failure signal output part. The power failure signal output part outputs a final power failure sensing signal based on at least one signal of two signals, that is, an outside power failure signal is generated from the external signal input part when the external device has a power failure and an interior power failure signal is generated when the use apparatus has a power failure. That is, according to the power failure sensing device having the configuration as described above, a final power failure sensing signal can be generated when at least one signal of the external device side and the use apparatus side controlled by the external device has the state of a power failure.

Further, in a card reader having a power failure sensing device according to the present invention a power failure sensing circuit of the card reader provides an outside signal input part receiving a power failure signal from a host external device and a power failure signal output part which outputs a final power failure sensing signal in response to at least one (signal) of an external power failure signal and an interior power failure signal. The outside power failure signal is generated from the outside signal input part when the host external device has a power failure, the interior power failure signal is generated when the card reader side has a power failure. That is, according to the card reader having the power failure sensing device having the configuration as described above, a final power failure sensing signal can be generated when at least one (signal) of the external device side and the use apparatus side controlled by the external device has the state of a power failure.

Moreover, a power failure sensing device or a card reader comprising power failure sensing device according to the present invention in a power failure signal output part has an open collector type output circuit so that a power failure signal output part can embody with a simple and cheap circuit.

BRIEF DESCRIPTION OF DRAWINGS

FIG. 2(a) is a diagram showing the state of a power failure sensing of the card reader side.

FIG. 2(b) is a diagram showing the state of a power failure sensing of the external device side, FIG. 2(c) is a diagram showing the state of a final power failure sensing.

FIG. 3 is a block diagram showing a circuit structure of a power failure sensing device of an another embodiment of the present invention.

DETAILED DESCRIPTION OF THE INVENTION

Figure 1:
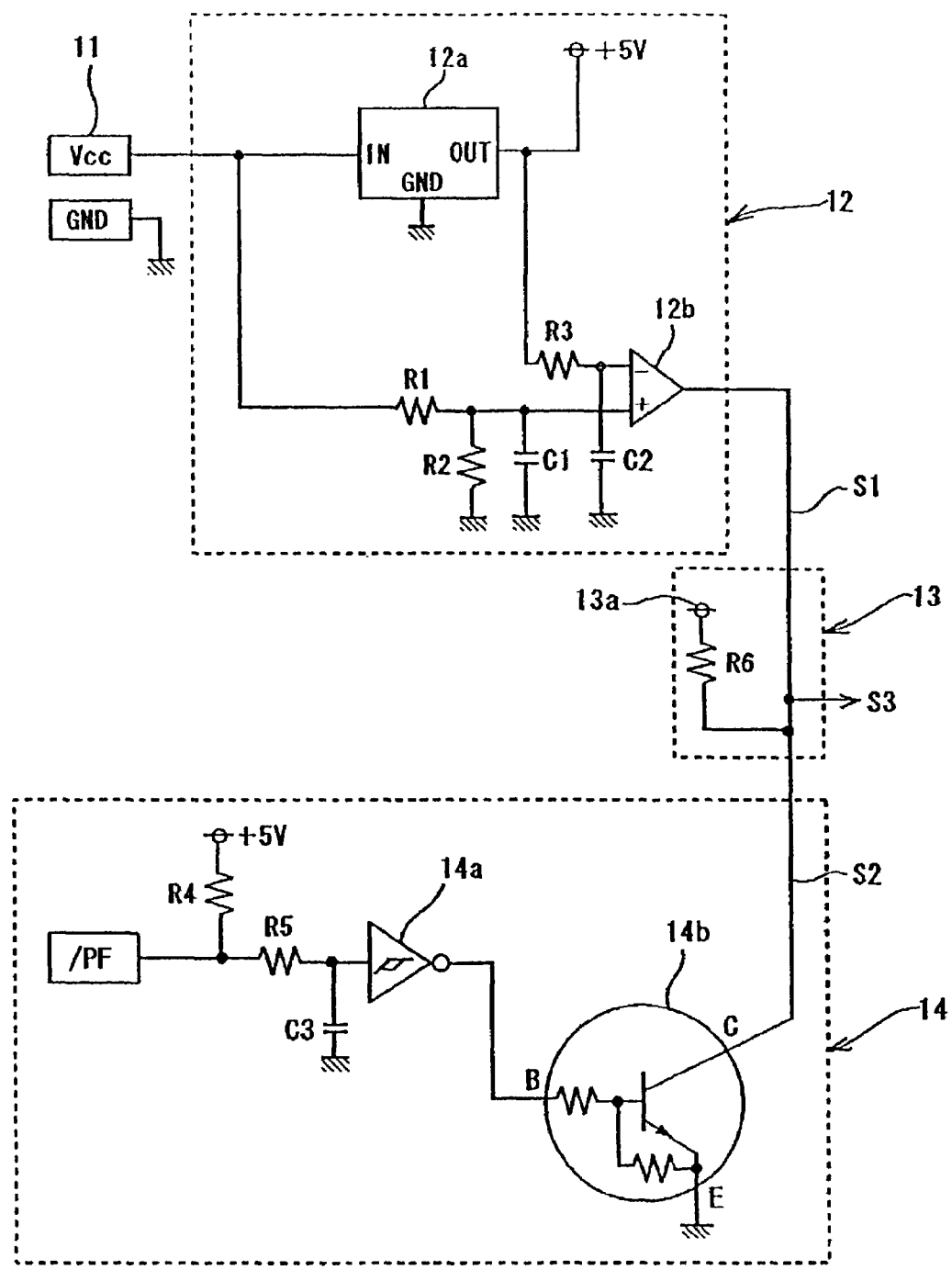
FIG. 1 is a block diagram showing a circuit structure of a power failure sensing device of a card reader according to one embodiment of the present invention.

A power failure sensing device in an embodiment shown in FIG. 1 applies the present invention to a card reader built in as a subordinate device in a cash dispenser as a host external device. The various operations that are carried out in the card reader of a use apparatus as the subordinate device is controlled based on command signals from the cash dispenser as the host external device and Interlocked operations carry out.

A power failure sensing device provided in the card reader provides a card reader power failure sensing circuit 12 to detect the state of a power failure in an internal electrical power source 11 provided for the card reader. Also, the main unit of the cash dispenser as the host external device provides a host device power failure sensing circuit to detect the state of a power failure of a power source with the main unit which omitted illustration.

In the card reader power failure sensing circuit 12, at first, an output voltage (24V) from an internal electrical power source 11 for the card reader is altered to a reference voltage (5V) by a 3-terminal regulator 12a. The reference voltage (5V) is inputted a minus side terminal of a comparator 12b of an open collector output type through a resistor R3 and a condenser C2 which eliminate a noise and a voltage drop of a short time and prevent from a malfunction of the circuit.

The output voltage from the internal electrical power source 11 (24V) is altered to e.g. a power failure sensing voltage Vp (=5×(R1+R2)/R2=19V) by resistors R1, R2. The power failure sensing voltage (19V, for example) is inputted to a plus side terminal of the above-described comparator 12b through a condenser C1 that eliminates a noise and a voltage drop of a short time and prevents from a malfunction of the circuit.

By this time, the card reader power failure sensing circuit 12 sets up that an open collector output from the comparator 12b is replaced with "L signal" when the internal electrical power source 11 for the card reader has a power failure. In addition, an interior power failure signal S1 of the card reader side comprising the "L signal" is inputted to a power failure signal output part 13.

The power failure signal output part 13 in the present embodiment is comprised an open collector type output circuit having a pull-up power 13a and a resistor R6. Further, an external signal input portion 14 is connected with the power failure signal output part 13 between the main unit of the cash dispenser comprising the host outside device as described above. That is, a host power failure sensing signal (/PF) is inputted in the external signal input part 14. The host power failure sensing signal (/PF) is generated by a power failure sensing circuit (not illustration) which is provided by the main unit of the cash dispenser as the host external device.

After the host power failure sensing signal (/PF) boosts to a constant voltage, the host power failure sensing signal (/PF) is inputted to an inverter 14a. The inverter 14a has a schmitt trigger circuit for chattering protection through a resistor R5 and a condenser C3 which eliminate a noise and a voltage drop of a short time and prevent from a malfunction of the circuit. Furthermore, an output of the inverter 14a is altered to a signal inverted the logic and the signal is inputted to a base terminal of a NPN transistor 14b with built-in resistor.

An output from a collector terminal of this transistor 14b is set up to be replaced with "L signal" when the main unit of the cash dispenser as the host external device has a power failure. Additionally, an external power failure signal S2 of the main unit of the cash dispenser side comprising the "L signal" is inputted to the above-described power failure signal output part 13.

The power failure signal output part 13 comprising the open collector type output circuit as described above is generated both "L signal", that is, the interior power failure signal of the card reader side and the external power failure signal of the main unit of the cash dispenser side, (which make) as a final power failure sensing signal S3. That is, according to the power failure sensing device of the card reader as described above, when at least one of the main unit of the cash dispenser side as the host external device and the card reader side controlled by the host outside device side has the state of a power failure, the power failure signal output part 13 is generated a final power failure sensing signal S3 comprising "L signal".

The state of a power failure of the main unit of the cash dispenser side as the host external device can be detected in addition to the state of a power failure of the card reader itself. For example, the state of a power failure of the internal electrical power source 11 of the card reader side, shown in FIG. 2(a), occurs within the range of that is, a level of a power failure sensing voltage Vp or less.

When the state of a power failure of the main unit of the cash dispenser side as the host external device occurs with a low level, as shown in FIG. 2(b), both the state of a power failure of the card reader side and the state of a power failure of the main unit of the cash dispenser side as the host external device are detected with a low level as shown in FIG. 2(c), Namely, in state "1" shown in FIG. 2, the internal electrical power source 11 of the card reader side holds a normal voltage, but the external power source of the host outside device side has the state of a power failure. Thus, a final power failure sensing signal S3 is generated.

In state of "2", both internal electrical power sources 11 of the card reader side and the external power source of the host outside device side hold a normal voltage so that a power failure sensing signal is not generated. Moreover, in state "3", the internal electrical power source 11 of the card reader side has the state of a power failure so that a final power failure sensing signal S 3is generated even if the external power source of the host outside device side holds a normal voltage. Also, in state of "4", which is the same as the state of "3" as described above, both internal electrical power sources 11 of the card reader side and the external power source of the host outside device side hold a normal voltage. Thus, a power failure sensing signal is not generated. Lastly, in state of "5", which is the same as the state of "3" as described above, the internal electrical power source 11 of the card reader side has the state of a power failure so that a final power failure sensing signal S3 is generated even if the external power source of the host outside device side holds a normal voltage.

Figure 6:
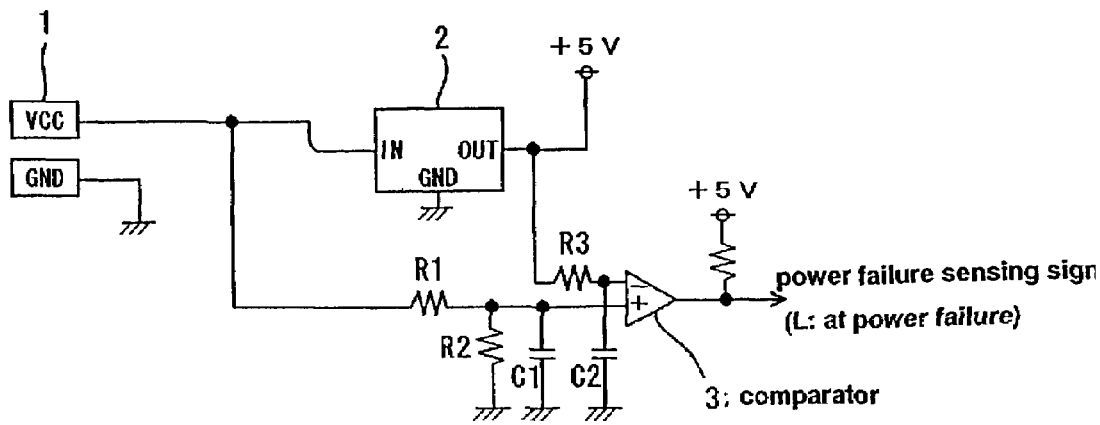
FIG. 6 is a block diagram showing a circuit structure of a power failure sensing device employed in a general card reader.

In a conventional device, when a power voltage suddenly fell, the time which can hold an output of a regulator (see reference number 2 in FIG. 6) after detecting a power failure is cut to correspond to the lower of the power voltage. In the present embodiment, to detect a power failure of the external device side can do (process) with speed so that the time which can hold an output of a regulator (see reference number 12 in FIG. 1) can be longer than that of the conventional device. Accordingly, It has enough execution (running) disposition time of various operations after a power failure so that it can afford to deal with processing operation after a power failure.

In the embodiment shown in FIG. 3, the power failure sensing circuit 12 of the card reader side is applied to a comparator 12b' of the positive type which is not an open collector output type. And, in correspondence with the comparator 12b', an AND gate IC23a is employed for the power failure signal output part 23.

Figure 4:
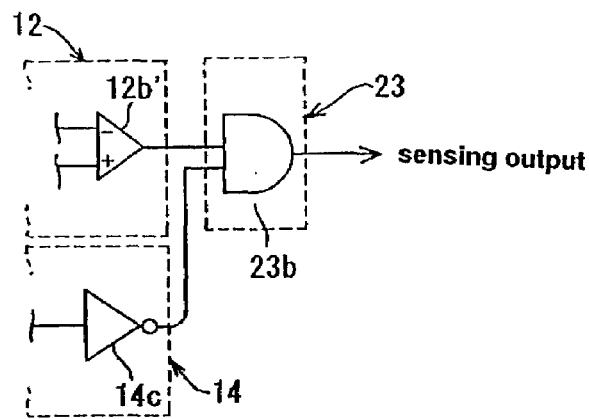
FIG. 4 is a block diagram showing a circuit structure of a power failure sensing device of a further another embodiment of the present invention.
Figure 5:
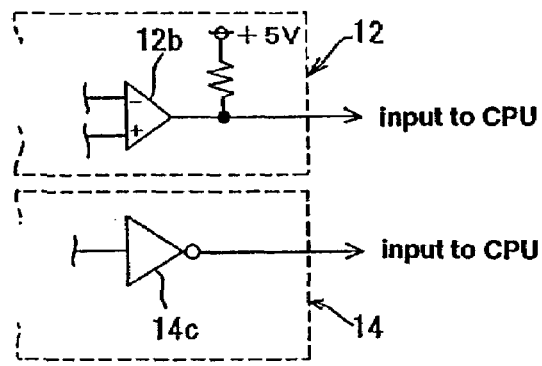
FIG. 5 is a block diagram showing a circuit structure of a power failure sensing device of a still further another embodiment of the present invention.

Moreover, the embodiment shown in FIG. 4 employs an inverter IC 14c in the external signal input part 14 for the transistor 14b of the described above embodiment in addition to the embodiment of FIG. 3 as described above. Also, an embodiment shown in FIG. 5 employs separated CPUs of the power failure sensing circuit 12 side and the external signal input part 14 side, respectively. The separated CPU uses instead of the AND gate IC23a used in the power failure signal output part 23 in the above described each embodiment shown in FIG. 3 and FIG. 4. An interior or outside power failure sensing signals which are inputted into each separated CPU are processed according to software using the same AND logic to detect a power failure which is the same as a described in the above embodiment.

A power failure sensing device according to the present invention, as described above, has a power failure sensing circuit of a use apparatus provides an outside signal input part receiving a power failure signal from an external device and a power failure signal output part, the power failure signal output part outputs a final power failure sensing signal based on at least one of two signals, that is, an outside power failure signal is generated from the external signal input part when the external device has a power failure and an interior power failure signal is generated when the use apparatus has a power failure.

The power failure sensing device generates a final power failure sensing signal when at least one of the external device side and the use apparatus side controlled by the external device has the state of a power failure. Accordingly, the state of a power failure of the external device side can be detected well with simple configuration in addition to detecting a power failure of the interior side of the use apparatus. And it can obtain the power failure sensing device with a high degree of reliability and inexpensively.

Further, a card reader having a power failure sensing device according to the present invention, as described above, includes a power failure sensing circuit of the card reader to provide an outside signal input part receiving a power failure signal from a host external device and a power failure signal output part, the power failure signal output part outputs a final power failure sensing signal based on at least one of two signals, that is, an outside power failure signal is generated from the external signal input part when the external device has a power failure and an interior power failure signal is generated when the card reader has a power failure.

Thus, the power failure sensing device generates a final power failure sensing signal when at least one of the external device side and the card reader side controlled by the external device has the state of a power failure. AS a result, the state of a power failure of the host external device side can be detected well with simple configuration in addition to detecting a power failure of the interior side of a card reader. Also, it can obtain a card reader having the power failure sensing device with a high degree of reliability and cheap.

Also, a power failure sensing device or a card reader having power failure sensing device according to present invention, in addition to the above, has a power failure signal output part which has an open collector type output circuit so that the power failure signal output part can embody with a simple and cheap circuit and it can make described above effect improve moreover.

It should be apparent to those skilled in the art that various modifications and variations may be made in apparatus and process of the present invention without departing from the spirit or scope of the invention. For example, each embodiment of the invention shown in FIGS. 3–5 have the same function and effect as described above. Further, the present invention is applied to a card reader in each embodiment described above, however, the present invention may be applied to other devices of various kinds in a similar manner.

What is claimed:

1. A power failure sensing device comprising:
   a power failure sensing circuit which outputs a power failure sensing signal to an internal electrical power source of a use apparatus provided to interlock an external device when an output voltage from an internal electrical power source falls below a predetermined level, wherein, said power failure sensing circuit of said use apparatus provides an outside signal input part receiving a power failure signal from said external device and;
   a power failure signal output part which outputs a final power failure sensing signal in response to at least one signal of an external power failure signal and an interior power failure signal, wherein said external power failure signal is generated from said outside signal input part when said external device has a power failure, said interior power failure signal being generated when said use apparatus has a power failure,
   wherein said use apparatus is a card reader and said external device is a host device which controls the card reader,
   the card reader is provided with an internal electrical power source and an outside signal input part which receives a power failure signal in the host device,
   wherein the card reader outputs a final power failure sensing signal in response to at least one of the power failure signal in the host device, which controls the card reader, and the internal power failure signal of the internal electrical power source of the card reader.

2. A method for a card reader having a power failure sensing device compromising the steps of:
   providing a power failure sensing circuit which outputs a internal power failure signal from an internal electrical power source of a card reader provided to interlock a host external device when an output voltage from said internal electrical power source falls in less than a predetermined level;
   providing an outside signal to an input part which receives a power failure signal from said host external device and which may output an external power failure signal to a power failure signal output part;
   outputting from a power failure signal output part a final power failure sensing signal in response to at least one signal of said external power failure signal or said internal power failure signal;
   providing the card reader with an internal electrical power source and an outside signal input part which receives a power failure signal; and
   outputting a final power failure sensing signal in response to at least one of the power failure signal in the host device, which controls the card reader, and the internal power failure signal of the internal electrical power source of the card reader.

3. The power failure sensing device of claim 1 wherein the card reader provides said output part uses an open collector type output circuit.

4. A power failure detection system for detecting power failures in a cash dispenser machine and in an associated card reader comprising:
   an external signal input part for receiving a power failure signal from a first power failure sensing circuit located in a host cash dispenser machine;
   a card reader associated with the cash dispenser;

an internal power source located in said card reader;
a second power failure sensing circuit located in said card reader; and,
a power failure signal output part for receiving and processing power failure signals from said external signal input part and from said second power failure sensing circuit, said power failure signal output part further including circuit to output a final power failure signal if either said card reader or said cash dispenser has a power failure and the shape of said final power failure signal indicates whether the card reader or the cash dispenser or both experience a power failure,
wherein the card reader is provided with an internal electrical power source and an outside signal input part which receives a power failure signal in the host device.

* * * * *